United States Patent [19]

Baughman et al.

[11] Patent Number: 4,550,014

[45] Date of Patent: Oct. 29, 1985

[54] METHOD FOR PRODUCTION OF FREE-STANDING POLYCRYSTALLINE BORON PHOSPHIDE FILM

[75] Inventors: Richard J. Baughman; David S. Ginley, both of Albuquerque, N. Mex.

[73] Assignee: The United States of America as represented by the United States Department of Energy, Washington, D.C.

[21] Appl. No.: 416,409

[22] Filed: Sep. 9, 1982

[51] Int. Cl.$^4$ .............................................. C01B 35/04
[52] U.S. Cl. ................................. 423/289; 423/299; 252/62.3 GA; 427/86; 427/87; 427/419.7; 156/610; 156/DIG. 70; 156/DIG. 88
[58] Field of Search ............................. 423/289, 299; 252/62.3 GA; 427/86, 87, 419.7; 156/610, DIG. 70, DIG. 88

[56] References Cited

U.S. PATENT DOCUMENTS

| | | | |
|---|---|---|---|
| 2,966,426 | 12/1960 | Williams et al. | |
| 3,073,679 | 1/1963 | Stone et al. | |
| 3,223,552 | 12/1965 | Sakurai et al. | 427/87 |
| 3,260,571 | 7/1966 | Gruber | |
| 3,279,891 | 10/1966 | Wenzel | |
| 3,340,009 | 9/1967 | Wenzel et al. | |
| 3,357,795 | 12/1967 | Kischio | |
| 3,363,984 | 1/1968 | Ruehrwein | |
| 3,395,986 | 8/1968 | Gruber | |
| 3,429,756 | 2/1969 | Groves | 156/17 |
| 3,617,371 | 11/1971 | Burmeister | 423/299 |
| 3,686,378 | 8/1972 | Dietze | 264/81 |
| 3,956,479 | 4/1976 | Reuschel et al. | 264/248 |
| 3,993,533 | 11/1976 | Mihes et al. | 156/613 |
| 4,370,288 | 1/1983 | Rice, Jr. et al. | 427/86 |

OTHER PUBLICATIONS

Kirpatrick, A. R. "A Nonconventional Approach to Tnin Cell Fabrication", Conf. Record. 13th IEEE Photovoltaic Specialists Conf., Jun. 5–8, 1978, pp. 1342–1346.
Suzuki et al., "Free Boron Monophosphide Wafers", Japan. J. Appl. Phys., vol. 16 (1977), No. 6, pp. 1053–1054.
Chu et al., "Gallium Arsenide Films on Recrystallized Germanium Films", *J. of Applied Physics*, vol. 48, No. 11, Nov. 1977, pp. 4848–4849.
Shohno, Ohtake, and Bloem, *Journal of Crystal Growth* 45, 187–191, (1978).
Nishinaga et al., *Japanese Journal of Applied Physics* 14, 753 (1975).
Chu et al., *Journal of Crystal Growth* 33, 53 (1976).
Suzuki et al., *Japan J. Appl. Phys.* 16, 1053 (1977).
Takigawa et al., *Japan J. Appl. Phys.* 16, 637 (1977).
Hirai et al., *Journal of Crystal Growth* 41, 124 (1977).

*Primary Examiner*—John Doll
*Assistant Examiner*—Jackson Leeds
*Attorney, Agent, or Firm*—Armand McMillan; Albert Sopp; Judson R. Hightower

[57] ABSTRACT

A process for producing a free-standing polycrystalline boron phosphide film comprises growing a film of boron phosphide in a vertical growth apparatus on a metal substrate. The metal substrate has a coefficient of thermal expansion sufficiently different from that of boron phosphide that the film separates cleanly from the substrate upon cooling thereof, and the substrate is preferably titanium. The invention also comprises a free-standing polycrystalline boron phosphide film for use in electronic device fabrication.

8 Claims, No Drawings

METHOD FOR PRODUCTION OF FREE-STANDING POLYCRYSTALLINE BORON PHOSPHIDE FILM

The U.S. Government has rights in this invention pursuant to Contract No. DE-AC04-76DP00789 between the U.S. Department of Energy and Western Electric Company.

BACKGROUND OF THE INVENTION

This invention relates to free-standing crystalline boron phosphide films, and to a method for preparation thereof.

Boron phosphide is desirable for use in device applications. More specifically, boron phosphide has already shown promise as a conductive anticorrosive coating. However, although boron phosphide's value as a semiconducting material has been appreciated, its full potential has not been developed because of difficulties encountered in obtaining free-standing material. Preparation of a free-standing crystalline film of boron phosphide would enable studies to be conducted to electrically characterize the material, as well as permitting device fabrication therewith.

The prior art processes for producing crystalline boron phosphide have all failed to achieve production of a free-standing film capable of use in many device applications. For instance, U.S. Pat. No. 2,966,426 teaches a process for forming boron phosphide, but only as a coating, or as a crushed material removed from the walls of a production chamber. This patent fails to teach the use of boron phosphide (hereinafter BP, as opposed to other boron phosphides such as $B_6P$, $B_{20}P$, $B_{70}P$ or $B_{100}P$, etc.) in electronic device applications.

U.S. Pat. No. 3,363,984 teaches a process wherein boron phosphide is produced in a hot tube reactor and thereafter scraped off the walls for use as an abrasive. U.S. Pat. No. 3,260,571 teaches production of $B_6P$ particles for use in semiconductor applications and U.S. Pat. No. 3,340,009 teaches production of monocrystals, as well as polycrystals of BP for use in electronic semiconductors. The crystalline BP of U.S. Pat. No. 3,340,009 is not in free-standing film form.

U.S. Pat. No. 3,395,986 teaches production of BP as a dispersed component in a solidified salt matrix. U.S. Pat. No. 3,357,795 teaches growth of BP crystals on the walls of a chamber and U.S. Pat. No. 3,279,891 teaches production of fine-crystalline BP.

However, none of the above-discussed references teaches a process for production of a free-standing film of highly pure BP.

OBJECTS OF THE INVENTION

It is thus an object of the present invention to provide a process for the production of a free-standing film of boron phosphide and the film so-produced.

It is another object of the invention to provide a process for the production of a free-standing film of boron phosphide of a size sufficient for use in fabrication of electronic semiconductor devices.

It is yet another object of the invention to provide such a process and film wherein the latter is polycrystalline, and/or highly pure.

Upon further study of the specification and appended claims, further objects and advantages of this invention will become apparent to those skilled in the art.

SUMMARY OF THE INVENTION

In accordance with the invention there is provided a process for producing a free-standing boron phosphide film comprising the sequential steps of: (1) heating a metal substrate, comprising titanium, molybdenum, tantalum or tungsten, in a vertical growth apparatus to a temperature sufficient to grow a boron phosphide film on said substrate by chemical vapor deposition; (2) flowing reactant gases over said metal substrate thereby growing a boron phosphide film thereon by chemical vapor deposition, the flow time being sufficient to grow a boron phosphide film of a predetermined thickness on said substrate; and (3) cooling said substrate and grown boron phosphide film to separate said boron phosphide film from said substrate as a result of the difference in rate of contraction of said metal substrate with respect to said boron phosphide film thereby producing a free-standing crystalline boron phosphide film, said difference in rates of contraction on cooling being sufficient to cause separation of the substrate from the film.

DETAILED DISCUSSION OF THE INVENTION

By free-standing film is meant a film capable of maintaining its structural integrity, i.e., resting on its own support, without attachment to, or added support. Generally, the film is polycrystalline in nature, and the precise crystalline structure will vary in accordance with the precise values selected for the various variables of the process for producing the film.

The process according to the invention is conducted in a vertical growth apparatus of the type having an RF induction coil for heating, and wherein epitaxial growth is achieved. These devices are well known to those skilled in the art and the specific configuration employed is not critical. It is only essential that the device be of the type used for achieving vertical growth of a film on a substrate supported therein.

A particularly preferred device employed in the process of the invention is a vertical growth apparatus of the type wherein an atmospheric chamber contains a graphite susceptor therein for supporting substrate materials thereon. To ensure that the temperature in the chamber, and specifically at the substrate is maintained constant, a monitoring thermocouple is embedded in the graphite susceptor directly beneath the region, i.e., top portion, whereon the substrate materials are supported. The entire assembly is mounted on, sealed and supported on a base support having a gas outlet communicating with the bottom of the atmosphere chamber for withdrawing gases therefrom. A gas inlet is located directly above the substrate materials for passing reactant gases thereonto. An RF induction coil is arranged outside and around the chamber at the level of the graphite susceptor and substrate materials to provide the necessary heating. This type of apparatus is generally used for vertical epitaxial growth on substrate materials in chemical vapor deposition, hereinafter CVD, process.

In accordance with the process, a metal substrate is supported on the graphite susceptor. Preferably, the metal substrate is titanium. However, other metals capable of use in the process are molybdenum, tantalum, and tungsten, it being noted that these metals fall out of Groups 4B-6B of the Periodic Table. The primary consideration in selecting the metal is as previously discussed, that its coefficient of thermal expansion as compared to the coefficient of thermal expansion of boron phosphide must differ sufficiently to result in a clean cleavage between the grown BP film and the metal substrate upon cooling thereof.

With reference to the cooling, although not critical, it is generally done to room temperature from the time power to the growth apparatus is shut-off. The grown film will generally pop-off at a temperature of about 500° C. The rate of cooling does not appear to affect the separation inasmuch as the process has also been conducted at slower than a room temperature rate with power maintained on until the temperature cooled to 600° C. at which time power was shut-off. What is evident is that the thinner the grown film, the faster the rate of cooling, and the thicker the film, the slower the rate of cooling.

Prior to commencing CVD, the substrate is etched and cleaned with, for example $HF/HNO_3/H_2O$ solution and hot methyl alcohol. The temperature of the substrate is then raised in the apparatus to remove any remaining chemicals thereon.

The etching and cleaning solutions and techniques are described in very specific detail in the example which follows, therefore it should be noted that any technique for purifying the surface of the substrate can be employed. More particularly, this technique is conventional and was chosen from one of several disclosed in TECHNIQUES OF METALS RESEARCH, Vol. II, part 1; ed. R. F. Bunshah, 1968 Inner Science N.Y., and more specifically, the chapter entitled "Techniques for the Direct Observation of Structures and Imperfections". Any other etching and cleaning technique specifically adapted for the above-discussed purpose will suffice, and the disclosure in the above-discussed reference is specifically incorporated by reference herein.

The substrate temperature is then lowered to about 650°–1050°, depending on the electronic properties desired in the film produced, and preferably 950° C. Reactant gases are then turned on and epitaxial growth commences.

Typical reactant gas flow rates are about 80 standard cc/min $B_2H_6$, generally fed in an $H_2$ carrier gas and about 40 standard cc/min of $PH_3$, again in $H_2$ carrier gas. These rates can be varied, again depending on the desired electronic characteristics. It is convenient however, to set the total gas flow at about 2500 standard cc/min. Thus, it will be clear to those skilled in the art that selection of the mass flow range of BP growth resulting from the above described specific values is conventional to those skilled in the art of CVD and can be varied without departing from the scope of the invention.

The parameters of the different gas flow rates can be varied so long as a sufficient mass flow range of BP growth is achieved as results from the selected values.

Growth is continued until the desired thickness and size BP layer is achieved, at which time the reactant gases are turned off while $H_2$ carrier gas flow is continued for the purpose of flushing the chamber. After an approximately 5 minute flush period, and necessarily not less than about 3–4 minute flush period, the power is turned off. The time of flushing is determined as the amount of time necessary to remove all gases other than $H_2$ from the chamber, and the above values are only set forth as typical values.

Cooling of the BP film and the substrate commences, typically at a rate of 100° C./min until the temperature reaches 150°–250° C. This usually takes 5 to 10 minutes. During this cooling period, due to the difference in coefficients of thermal expansion, the BP film cleaves cleanly from the metal substrate.

The resultant film has no detectable metal substrate impurities in it, is free-standing in nature, and typically polycrystalline with the crystal sizes varying according to the various parameters of the process.

The resultant film has very good electrical properties for electronic device applications, in particular for the fabrication of devices such as high temperature electronic devices, photovoltaics, sensors such as neutron sensors, etc. In these applications, one advantage is that the free-standing film employed uses very little material to achieve electronic properties equivalent to those achieved using much greater amounts of other semiconducting materials of the type conventionally employed in device fabrication.

The described process has been effective to produce free-standing BP films of a size up to 4 $cm^2$, although this size was limited only by the size of the growth apparatus used. Thus, it is expected that even larger free-standing films can be grown according to the process of the invention.

Although it is desirable to have thin free-standing films, i.e., free-standing films only thick enough to have no pinholes therein, free-standing BP films of at least 150 microns have been produced by the process.

The process as described provides numerous advantages not previously available. For instance, the system allows for use of metal substrates in the growth process and apparatus without their being melted by preferential inductive heating of the thin conductive materials. The use of titanium, or other suitable substrate, allows for sufficient adhesion of the growing BP film during growth, and a clean scission at the interface upon cooling, allowing for reuse of the substrates. The growth schedule of flow rates and temperatures enables the growth of very thick layers, greater than 150 microns. There are no detectable substrate impurities incorporated in the grown BP layers.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following example, all temperatures are set forth uncorrected in degrees Celsius; unless otherwise indicated, all parts and percentages are by weight.

EXAMPLE

In a specific example, a titanium substrate was etched in $HF/HNO_3/H_2O$ solution (in a 1:1:50 ratio) for approximately 30 seconds. The substrate was cleaned in hot absolute methyl alcohol and loaded into the growth apparatus. The atmosphere chamber was purged with $H_2$ gas for about 30 minutes. Power was turned on and the temperature of the Ti substrate raised to 1200° C. and held for 5 mins. It was not desirable to maintain at this temperature any longer to avoid excess hydride formation. The Ti substrate temperature was then lowered to 950° C. Reactant gases were then turned on and epitaxial growth commenced. Reactant gas flow rates were 80 standard cc/min for $B_2H_6$ (1.1% $B_2H_6$ in $H_2$ carrier gas) and 40 standard cc/min for $PH_3$ (4.48% $PH_3$ in $H_2$ carrier gas). Total gas flow was set at 2500 standard cc/min. Growth was continued until the desired BP layer thickness was achieved.

The reactant gases were then turned off while flushing for about 5 minutes with $H_2$ was conducted. The power was then turned off. Cooling began to room temperature at a rate of about 100° C./min and when the temperature reached 250° to 150°, the BP had separated from the substrate and the free-standing polycrystalline BP film was removed for use in various applications.

The preceding example can be repeated with similar success by substituting the generically or specifically described reactants and/or operating conditions of this invention for those used in the preceding example. From the foregoing description, one skilled in the art can easily ascertain the essential characteristics of this invention, and without departing from the spirit and scope thereof, can make various changes and modifications of the invention to adapt it to various usages and conditions. For instance, it is believed that the process has application in the production of numerous other semiconducting material free-standing films for device fabrication, i.e., boron arsenide (BAs), boron arsenic phosphide ($BAs_xP_{1-x}$) for example.

What is claimed is:

1. A process for producing a free-standing boron phosphide film comprising the sequential steps of: (1) heating a metal substrate, selected from the group consisting of titanium, molybdenum, tantalum or tungsten, in a vertical growth apparatus to a temperature of about 650°–1050° C.; (2) flowing reactant gases over said metal substrate thereby growing a boron phosphide film thereon by chemical vapor deposition, the flow time being sufficient to grow a boron phosphide film of a predetermined thickness on said substrate; and (3) cooling said substrate and grown boron phosphide film to cause separation of said boron phosphide film from said substrate as a result of the difference in rate of contraction of said metal substrate with respect to said boron phosphide film thereby producing a free-standing crystalline boron phosphide film, said difference in rates of contraction on cooling being sufficient to cause separation of the substrate from the film.

2. A process according to claim 1 further comprising etching and cleaning said metal substrate prior to placing it in the vertical growth apparatus, and preheating said substrate after placing it in the vertical growth apparatus to a temperature higher than said growth temperature for a time sufficient to evaporate cleaning material impurities therefrom before lowering its temperature to the growth temperature.

3. A process according to claim 1 or 2 further comprising purging the vertical growth apparatus of all reactant gas before commencing cooling of said substrate and film.

4. A process according to claim 1, wherein said substrate is a titanium substrate.

5. A process according to claim 1, wherein said etching and cleaning comprises etching with an $HF/HNO_3/H_2O$ solution for about 30 seconds, and subsequently cleaning with hot absolute methyl alcohol.

6. A process according to claim 1, wherein said temperature is about 950° C.

7. A process according to claim 6, wherein said flowing reactant gases step comprises flowing a mixture of $B_2H_6$ in $H_2$ carrier gas by weight and a mixture of $PH_3$ in $H_2$ carrier gas by weight onto the titanium substrate.

8. A process according to claim 7, wherein the gas flow rate of $B_2H_6$ is 80 standard cc/min, and the gas flow rate of the $PH_3$ is 40 standard cc/min.

* * * * *